(12) United States Patent
Higashi et al.

(10) Patent No.: US 8,114,705 B2
(45) Date of Patent: Feb. 14, 2012

(54) ELECTRICALLY-CONDUCTIVE INORGANIC COATING, METHOD FOR PRODUCING THE COATING, CIRCUIT BOARD, AND SEMICONDUCTOR APPARATUS

(75) Inventors: Kohei Higashi, Ashigarakami-gun (JP); Atsushi Tanaka, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 302 days.

(21) Appl. No.: 12/473,746

(22) Filed: May 28, 2009

(65) Prior Publication Data
US 2009/0294964 A1 Dec. 3, 2009

(30) Foreign Application Priority Data
May 30, 2008 (JP) .................................. 2008-143254

(51) Int. Cl.
H01L 51/40 (2006.01)
(52) U.S. Cl. ............ 438/99; 438/158; 438/584; 257/40; 257/59
(58) Field of Classification Search ............ 438/99, 438/158, 584, 796; 257/40, 59, E21.3, E21.328; 427/99.2, 596
See application file for complete search history.

(56) References Cited

U.S. PATENT DOCUMENTS
7,067,843 B2 * 6/2006 Carcia et al. .................... 257/59
7,626,196 B2 * 12/2009 Hirakata et al. ................ 257/40

FOREIGN PATENT DOCUMENTS
JP 2005-019101 A 1/2005
JP 2006-165467 A 6/2006
* cited by examiner

*Primary Examiner* — David Vu
(74) *Attorney, Agent, or Firm* — Sughrue Mion, PLLC

(57) ABSTRACT

A method for producing an electrically-conductive inorganic coating includes depositing, on a substrate, a coating-precursor containing a plurality of inorganic particles and at least one kind of organic component by a liquid-phase method by using a material-liquid containing the inorganic particles and an organic solvent. The inorganic particles are coated with a dispersant binding to the surfaces of the inorganic particles by chemical bonds that can be broken by oxidation. Further, the method includes oxidizing the coating-precursor at a temperature exceeding 100° C., and that is less than or equal to the pyrolysis initiation temperature of an organic component that has the highest pyrolysis initiation temperature among the at least one kind of organic component and less than or equal to the heat-resistance temperature of the substrate, thereby breaking the chemical bonds to eliminate the dispersant from the surfaces, and decomposing the at least one kind of organic component.

12 Claims, 5 Drawing Sheets

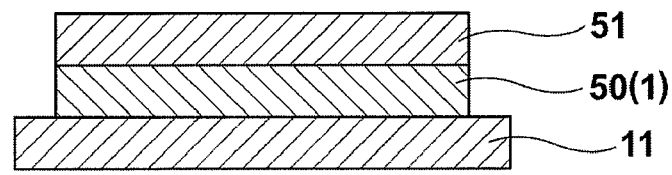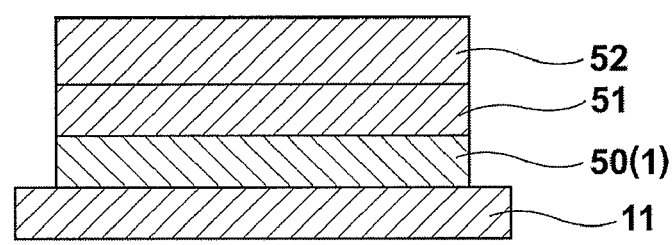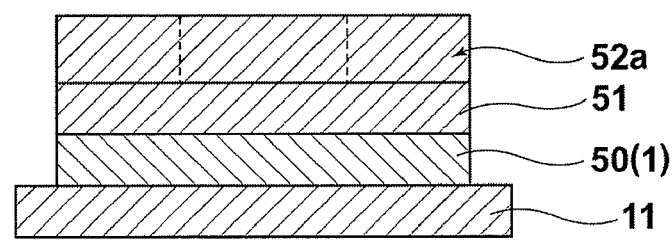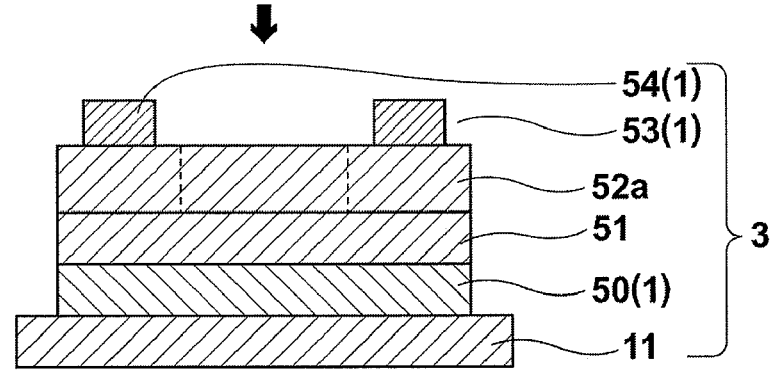

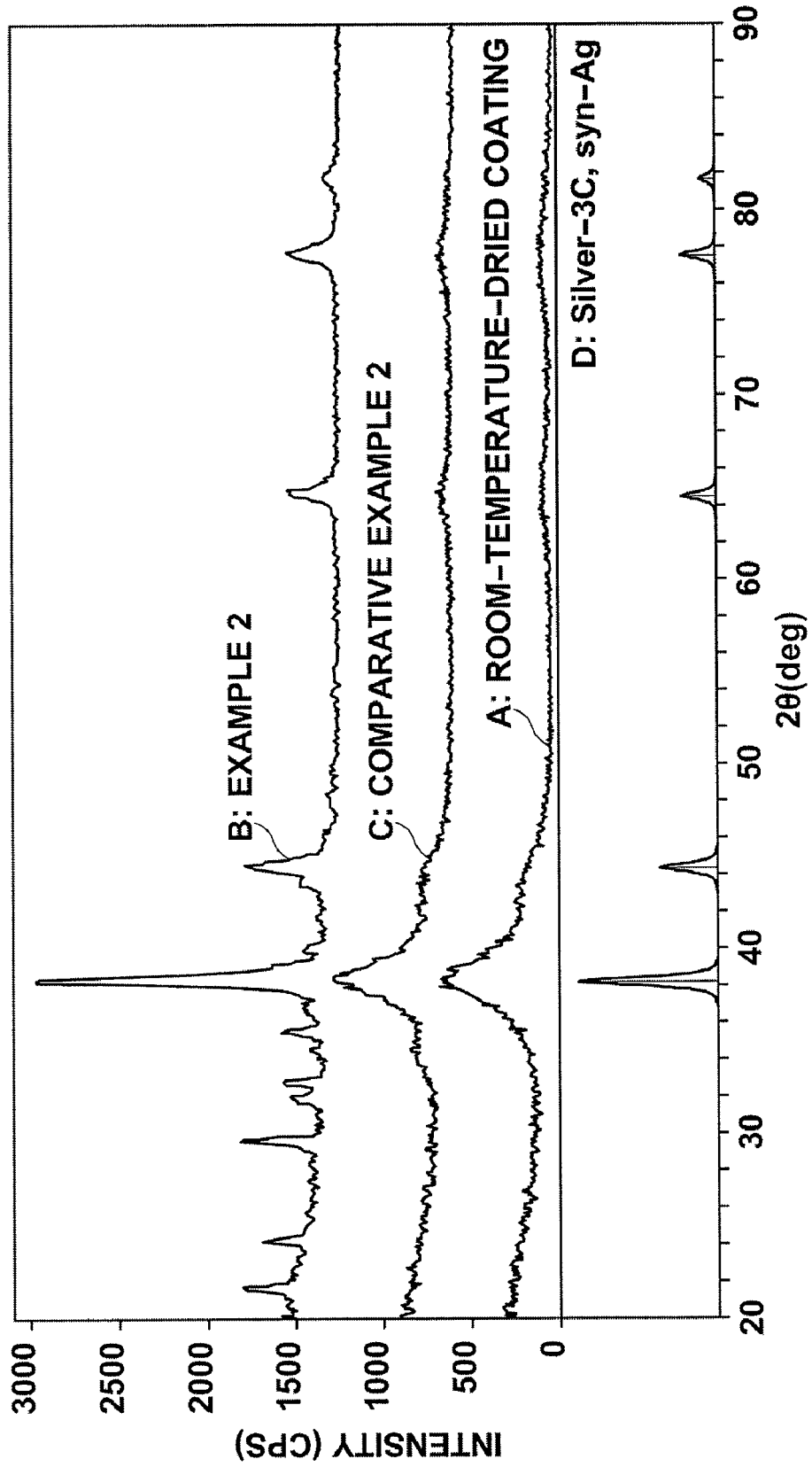

ELECTRICALLY-CONDUCTIVE INORGANIC COATING, METHOD FOR PRODUCING THE COATING, CIRCUIT BOARD, AND SEMICONDUCTOR APPARATUS

BACKGROUND OF THE INVENTION

1. Field of the Invention

The present invention relates to an electrically conductive inorganic coating (thin-film) and a method for producing the electrically conductive inorganic coating. Further, the present invention relates to a circuit board using the electrically conductive inorganic coating and a semiconductor apparatus using the electrically conductive inorganic coating.

2. Description of the Related Art

In recent years, various kinds of flexible devices have been receiving increasing attention. The flexible devices can be applied to various purposes, such as electronic paper (e-paper) and a flexible display. Conventionally, the flexible devices are produced, in a manner similar to production of devices that use glass substrates, mainly by vacuum deposition, such as a sputtering method and a vacuum deposition (evaporation) method, and patterning by photolithography. The conventional methods have excellent regeneration characteristics, and highly precise patterning can be performed. However, since the pattern is formed by temporarily depositing a coating onto the entire area of the substrate or the like first and by removing unneeded portion therefrom, the process is complicated and high cost.

Therefore, in recent years, a method using a direct drawing technique has been studied, as a method for producing flexible devices, to lower the cost for producing such devices. In the direct drawing technique, desirable patterns, such as circuits, are directly drawn on the substrates. Examples of direct drawing methods are printing methods, such as inkjet printing and screen printing, and a material liquid containing a composition material of the coating is applied to the substrate or the like to print. Since this method does not require any vacuum process, and patterning can be performed by direct drawing, it is possible to produce the devices easily and at low cost.

For example, production of wiring, such as circuits, and electrodes by using the direct drawing technique is studied. In this case, a paste-type inorganic-particle dispersant is used as a material liquid. In the inorganic-particle dispersant, electrically-conductive inorganic particles, such as metal, are dispersed in an organic solvent. The inorganic-particle dispersant is applied to the substrate or the like to form a desirable pattern, and fired to form micro circuits and electrodes.

However, flexible devices use resin substrates that have lower heat-resistance than the inorganic substrates, such as glass substrate. Therefore, in production of the flexible devices, it is necessary to keep the temperatures of the substrates lower than or equal to the heat-resistance temperatures of the substrates throughout the production processes. The heat-resistance temperatures of the resin substrates vary according to the types of the materials of the substrates, but they are normally in the range of 150 to 200° C. Even the heat-resistance temperature of a material, such as polyimide, that has relatively high heat-resistance is approximately 300° C.

Japanese Unexamined Patent Publication No. 2006-165467 (Patent Literature 1) discloses a method for producing an electronic device. In the method, an ultrafine-particle dispersant containing a metal element or a metal element compound that has an average particle diameter of less than 1000 nm is applied to the surface of the substrate to form a coating. Further, the coating is irradiated with a laser beam from the front side or the back side of the substrate to form a metal element layer or a metal element compound layer on the substrate. Patent Literature 1 discloses selective heating to limit heating to the coating by appropriately selecting the wavelength of the laser beam. The wavelength is selected in such a manner that the absorption rate of the laser beam at the substrate is low, thereby firing the coating without affecting the substrate (please refer to paragraph [0014] of Patent Literature 1).

According to the production method disclosed in Patent Literature 1, even when the substrate onto which the coating is deposited is the resin substrate, the ultrafine-particle dispersant of a metal element or a metal element compound can be fired while the temperature of the resin substrate is kept less than or equal the heat-resistance temperature of the resin substrate. However, in the method disclosed in Patent Literature 1, there is a risk that an organic substance, such as the organic solvent in which the ultrafine particles are dispersed and the dispersant that coats the surfaces of the ultrafine-particles, is not decomposed and remains when firing is carried out. When the coating that contains the organic substance, such as the dispersant and the organic solvent, is irradiated with a laser beam, the coating ablates (evaporates instantly), and the metal or metal compound particles are not united with each other. Therefore, it is impossible to obtain an electrically-conductive coating.

Especially, when the metal particles are dispersed in a colloid state, in which the metal particles are stably dispersed, there is a higher possibility that the dispersant remains without being decomposed. However, if a material liquid that does not have efficient dispersion stability is used, metal nanoparticles in the material liquid tend to cohere at a low temperature. Therefore, when the material liquid is applied in inkjet printing or the like, the metal nanoparticles cohere in the inkjet nozzle and form particles that have diameters on the order of greater than or equal to several tens of micrometers (μm), and clogging of the nozzle tends to occur. Further, the metal nanoparticles cohere in the vicinity of the nozzle, and that may cause a bad droplet flight condition. Further, when the particles cohere, the diameters of the cohered particles become varied, in other words, the diameters are not uniform. Therefore, particles that have various diameters are output from the nozzle, and it becomes impossible to apply the material to the substrate or the like so that a desirable pattern is formed. Hence, stable production becomes impossible.

SUMMARY OF THE INVENTION

In view of the foregoing circumstances, it is an object of the present invention to provide a method for stably producing a low-resistance electrically-conductive inorganic coating, using an inorganic-particle dispersant, in a low-temperature process that is lower than or equal to the heat-resistance temperature of a resin substrate.

Further, it is another object of the present invention to provide an electrically-conductive inorganic coating that is appropriate for a circuit board, such as a flexible device, by using the method for producing the low-resistance electrically-conductive inorganic coating. Further, it is another object of the present invention to provide a circuit board and a semiconductor apparatus that use the electrically-conductive inorganic coating.

Further, the main target of the present invention is a flexible device using a resin substrate. However, it is not necessary that the substrate is the resin substrate. The present invention may be applied to a substrate other than the resin substrate.

A method for producing an electrically-conductive inorganic coating according to the present invention is a method for producing an electrically-conductive inorganic coating, the method comprising the steps of:

(A) depositing, on a substrate, a coating precursor that contains a plurality of inorganic particles and at least one kind of organic component by a liquid phase method by using a material liquid containing the plurality of inorganic particles and an organic solvent, the plurality of inorganic particles coated with a dispersant that binds to the surfaces of the inorganic particles by chemical bonds that can be broken by oxidation; and (B) oxidizing the coating precursor at a temperature that exceeds 100° C., and that is less than or equal to the pyrolysis initiation temperature of an organic component that has the highest pyrolysis initiation temperature among the at least one kind of organic component contained in the coating precursor, and that is less than or equal to the heat-resistance temperature of the substrate, thereby breaking the chemical bonds between the dispersant and the surfaces of the inorganic particles contained in the coating precursor to eliminate the dispersant from the surfaces of the inorganic particles, and decomposing the at least one kind of organic component contained in the coating precursor to form the electrically-conductive inorganic coating, wherein step A and step B are sequentially carried out.

Here, "the pyrolysis initiation temperature of an organic component that has the highest pyrolysis initiation temperature among the at least one kind of organic component contained in the coating precursor" is obtained by performing thermal analysis on the material liquid that is used in the step A by TG/DTA (thermogravity/differential thermo analysis) measurement, to obtain a TG/DTA curve. The temperature of the material liquid is increased by a constant temperature (value) during the analysis. The pyrolysis initiation temperature is calculated from the obtained TG/DTA curve as described below. As illustrated in FIG. 2, first, tangent line L1 is drawn at inflection point P of the TG curve in region A that is immediately before the exothermic peak of the DTA curve, and which is on the low-temperature side of the exothermic peak of the DTA curve. Further, tangent line L2 is drawn at inflection point Q that is the closest to the inflection point P among inflection points of the TG curve in region B that is located on the low-temperature side of the region A. Further, intersection R of the tangent lines L1 and L2 is obtained, and temperature $T_R$ located at the intersection R is obtained as "the pyrolysis initiation temperature of an organic component that has the highest pyrolysis initiation temperature among the at least one kind of organic component contained in the coating precursor".

Further, the "chemical bonds that can be broken by oxidation" include not only chemical bonds that can be broken directly by oxidation but chemical bonds that can be broken by interaction between the inorganic particles and a different substance surrounding the inorganic particles.

Further, the term "heat-resistance temperature of the substrate" means the upper limit of temperature at which the rate of a change in the light transmissivity of the substrate and the rate of a change in the degree of polarization of the substrate remain less than or equal to 1% when the substrate is left in an atmosphere at predetermined temperatures for 30 minutes (changes in 30 minutes).

Further, the method for producing the electrically-conductive inorganic coating of the present invention can be applied in a desirable manner when the heat-resistance temperature of the substrate is less than or equal to 200° C., and optionally when the heat-resistance temperature of the substrate is less than or equal to 150° C.

Further, the inorganic particles may contain, as a main component, at least one kind of inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, and In, and alloys of these elements, and oxides of these elements.

In the specification of the present application, the term "main component" is defined as a component the content of which is higher than or equal to 80 mass %.

For example, the oxidizing process in the step B may use oxygen radicals. Further, the oxidizing process in the step B may include irradiation of the coating precursor with ultraviolet rays that have wavelengths of 400 nm or less in presence of oxygen or ozone, or irradiation of the coating precursor with oxygen plasma.

Further, the method for producing the electrically-conductive inorganic coating of the present invention can be applied in a desirable manner when the average particle diameter of the inorganic particles is less than or equal to 100 nm.

Further, it is desirable that the method for producing the electrically-conductive inorganic coating of the present invention further includes the step of:

(C) firing the electrically-conductive inorganic coating at a temperature less than or equal to the heat-resistance temperature of the substrate after the step B. The firing process in the step C may be carried out by a heating process using heat rays, such as a laser beam.

Further, a circuit board according to the present invention is a circuit board comprising:

a circuit and/or electrodes obtained by using the electrically-conductive inorganic coating produced by using the method for producing the electrically-conductive inorganic coating of the present invention.

Further, a semiconductor apparatus of the present invention is a semiconductor apparatus comprising:

a circuit and/or electrodes obtained by using the electrically-conductive inorganic coating produced by using the method for producing the electrically-conductive inorganic coating of the present invention.

Japanese Unexamined Patent Publication No. 2005-019101 discloses a method for forming a thin-film by using a coating method. The method for forming the thin-film includes, between the coating step and the firing step, the step of removing impurities at the surface of the coating by using an oxidation acceleration gas containing ozone or oxygen radicals. Further, it is described that oxidation using the oxidation acceleration gas can decompose the organic substance remaining in the coating, thereby reducing the residual impurity ratio at the surface of the coating and improving the crystalline characteristic (please refer to paragraphs [0011], [0012] and the like). Therefore, decomposition of the organic substance in the coating precursor by oxidation may be a known technique.

Meanwhile, in the method for producing the electrically-conductive inorganic coating of the present invention, the dispersant that coats the inorganic particles in the coating precursor is eliminated by oxidation, and the organic substance remaining in the coating is decomposed by oxidation. In the present invention, these two actions, namely, elimination of the dispersant and decomposition of the organic substance, make it possible to fire the electrically-conductive inorganic coating in a low-temperature process without limiting the dispersion stability of the dispersant that is used to coat the inorganic particles. In contrast, Japanese Unexamined Patent Publication No. 2005-019101 fails to teach or suggest such an advantageous effect.

In the method for producing the electrically-conductive inorganic coating of the present invention, a coating precursor is deposited by a liquid phase method by using a material liquid containing a plurality of inorganic particles and an organic solvent, the plurality of inorganic particles coated with a dispersant that binds to the surfaces of the inorganic particles by chemical bonds that can be broken by oxidation. After then, the coating precursor is oxidized at a temperature that exceeds 100° C., and that is less than or equal to the pyrolysis initiation temperature of an organic component that has the highest pyrolysis initiation temperature among the at least one kind of organic component, and that is less than or equal to the heat-resistance temperature of the substrate, thereby forming the electrically-conductive inorganic coating from the coating precursor. The oxidation under such conditions can eliminate the dispersant that coats the inorganic particles from the surfaces of the inorganic particles, and efficiently decompose the organic component included in the coating precursor, thereby changing the coating precursor to the electrically-conductive inorganic coating. Therefore, in the present invention, even if the electrically-conductive inorganic coating is fired in a low-temperature process in which the temperature is less than or equal to the heat-resistance temperature of the resin substrate, union, fusion or the like of the inorganic particles among each other is not prevented by the remaining organic substance, because the amount of the remaining organic substance is small. Hence, it is possible to form a low-resistance electrically-conductive inorganic coating.

Further, in the method for producing the electrically-conductive inorganic coating of the present invention, even if the dispersant that coats the surfaces of the inorganic particles is highly stable, it is possible to remove the dispersant from the surfaces of the inorganic particles in an efficient manner. Therefore, it is possible to use, as a material liquid, a dispersant of inorganic particles the surfaces of which are coated with the dispersant that has high thermal stability even in a low-temperature process. Hence, it is possible to prevent cohesion of the inorganic particles in the material liquid before coating, thereby stably producing the electrically-conductive inorganic coating.

Further, according to the method for producing the electrically-conductive coating of the present invention, it is possible to produce a low-resistance electrically-conductive inorganic coating that is appropriate for a circuit board, such as a flexible device, by using a liquid phase method. Further, it is possible to stably produce a circuit board and a semiconductor apparatus that use the electrically-conductive inorganic coating. Since the electrically-conductive inorganic coating is produced by using the liquid phase method, patterning by direct drawing is possible. Therefore, a circuit board and a semiconductor apparatus including circuits and electrodes having low resistivity and excellent electrical conductivity can be produced easily through a low cost process.

BRIEF DESCRIPTION OF THE DRAWINGS

FIG. 5A is a sectional view illustrating the process of producing a semiconductor apparatus according to an embodiment of the present invention;

FIG. 5B is a sectional view illustrating the process of producing the semiconductor apparatus according to an embodiment of the present invention;

FIG. 5C is a sectional view illustrating the process of producing the semiconductor apparatus according to an embodiment of the present invention;

FIG. 5D is a sectional view illustrating the process of producing the semiconductor apparatus according to an embodiment of the present invention; and FIG. 6 is a diagram illustrating XRD patterns of coatings dried at room temperature in Examples 1 and 2 and a coating of Comparative Example 2.

DESCRIPTION OF THE PREFERRED EMBODIMENTS

Electrically-Conductive Inorganic Coating

Figure 1:
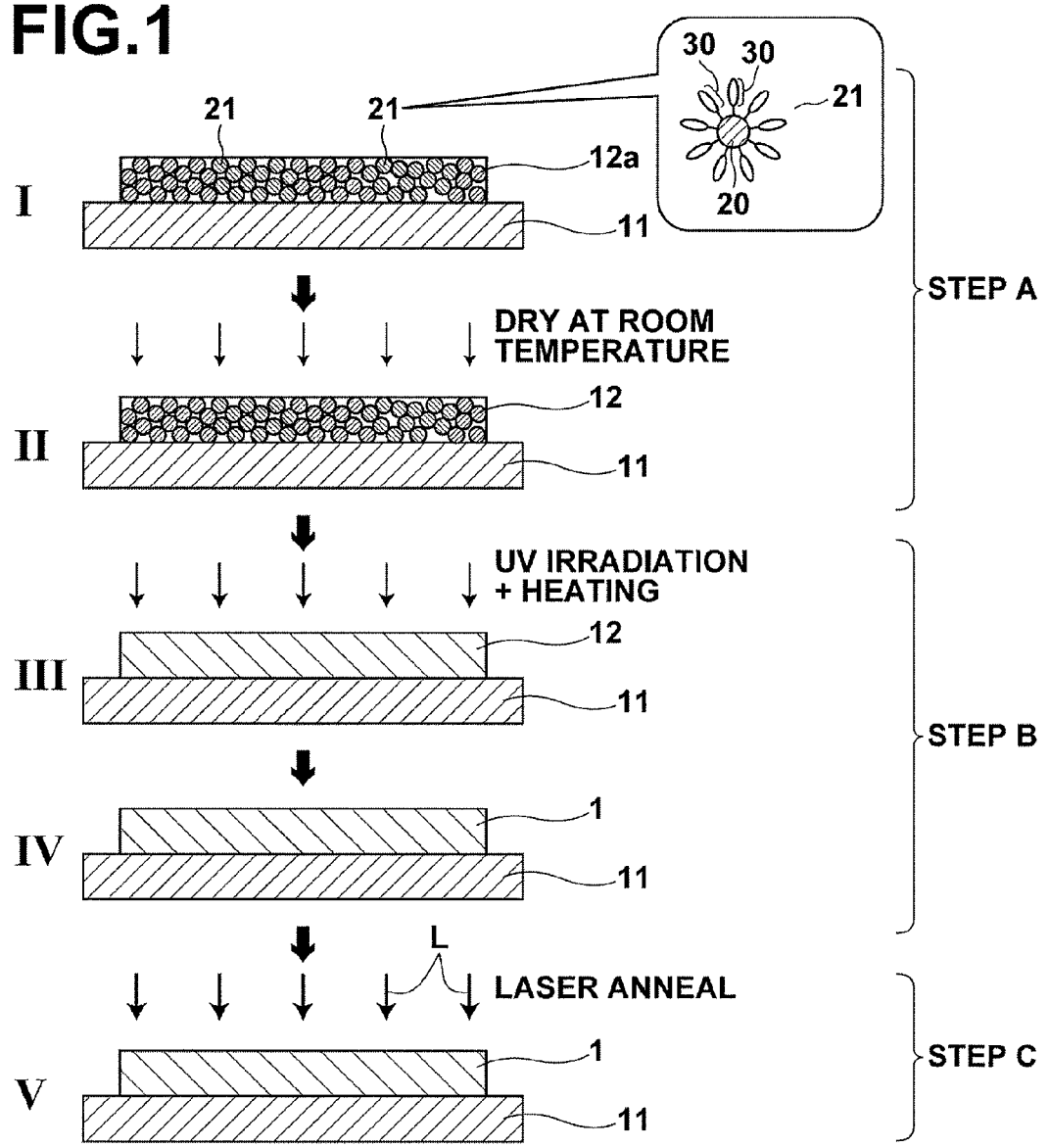
FIG. 1 is a diagram illustrating processes I through V for producing an electrically-conductive inorganic coating according to an embodiment of the present invention.

With reference to drawings, an electrically-conductive inorganic coating according to an embodiment of the present invention and a method for producing the electrically-conductive inorganic coating will be described. FIG. 1 is a diagram illustrating the process of producing the electrically-conductive inorganic coating (a sectional diagram in the thickness direction of the substrate). In FIG. 1, the elements are illustrated on a different scale from the actual sizes of the elements so that they are easily recognized.

An electrically-conductive inorganic coating 1 in the present embodiment is produced by a liquid phase method by using a material liquid containing a multiplicity (plurality) of inorganic particles and an organic solvent, and the surfaces of the plurality of inorganic particles are coated with a dispersant that binds to the surfaces of the inorganic particles by chemical bonds that can be broken by oxidation.

The material of the electrically-conductive inorganic coating 1 is not particularly limited, but it is desirable that the electrically-conductive inorganic coating 1 is a metal coating.

Further, the electrically-conductive inorganic coating 1 may be used as a circuit board of a flexible device, electrodes, circuits or the like of a TFT (thin-film transistor) semiconductor apparatuses.

Next, a method for producing the electrically-conductive inorganic coating 1 will be described.

<Step A>

First, as illustrated in process I of FIG. 1, a substrate 11 is prepared, and a coating 12a is deposited on the substrate 11. The coating 12a is deposited on the substrate 11 by applying a material liquid containing an electrically-conductive inorganic element (hereinafter, referred to as "inorganic-coating composition element") that constitutes an electrically-conductive inorganic coating 1. The material liquid contains a multiplicity (plurality) of dispersion particles 21 and an organic solvent, and each of the multiplicity of dispersion particles 21 includes an inorganic particle 20 the surface of which is coated with dispersant 30. The dispersant 30 binds to the surfaces of the inorganic particles 20 by chemical bonds that can be broken by oxidation.

The method for applying the material liquid to the substrate is not particularly limited. The material liquid may be applied by using various kinds of coating methods, such as spin coating and dip coating, or by using a printing method, such as inkjet printing and screen printing. When the printing method, such as the inkjet printing and the screen printing, is used, it is possible to directly draw a desirable pattern.

In the present embodiment, the substrate 11 is a resin substrate. A base coating, such as an insulation coating, may be formed on the resin substrate. In the present invention, it is possible to produce a low-resistance electrically-conductive inorganic coating in a relatively-low-temperature process in which the temperature of the resin substrate remains less than or equal to the heat-resistance temperature of the resin substrate. Therefore, a resin substrate that has a heat-resistance temperature of less than or equal to 200° C. may be used. Further, the present invention may be applied to a resin substrate that has a heat-resistance temperature of less than or equal to 150° C. As a TFT (thin-film transistor) for a flexible display, a resin substrate, such as polyethylene terephthalate (PET), polyethylene naphthalate (PEN), and polyimide (PI), is used, and it is desirable to use a substrate made of PET or PEN, which is cheap, and which has a heat-resistance temperature of less than or equal to 200° C. Further, examples of desirable materials for the resin substrate are polycarbonate (PC), polyarylate (PAR), aromatic polyether ketone (PEEK), aromatic polyether sulfone (PES), wholly aromatic polyketone, cyclic olefine polymers, liquid crystal polymers and the like.

As described above, in step A, the material liquid contains the inorganic-coating composition element, which constitutes the electrically-conductive inorganic coating 1. The material liquid contains the multiplicity (plurality) of dispersion particles 21 and the organic solvent, and each of the multiplicity of dispersion particles 21 includes an inorganic particle 20 the surface of which is coated with dispersant 30. The dispersant 30 binds to the surfaces of the inorganic particles 20 by chemical bonds that can be broken by oxidation. Further, the material liquid may contain an organic binder, such as a resin, if necessary.

The material of the inorganic particle 20 is not particularly limited. However, when the electrically-conductive inorganic coating 1 is a metal coating, it is desirable that the inorganic particle is a metal particle or a metal oxide particle. For example, the inorganic particle 20 contains, as a main component, at least one kind of inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, and In, and alloys of these elements, and oxides of these elements. An inorganic substance that does not have electrical conductivity may be used as the inorganic particle as long as the electrically-conducting inorganic coating can be produced by using the method of the present invention. Still, it is more desirable that the inorganic particle 20 itself is electrically conductive.

Further, the average diameter of the inorganic particles 20 is not particularly limited. However, it is desirable that the average diameter of the inorganic particles 20 is less than or equal to 100 nm to enable firing at a low temperature, and optionally, the average diameter may be less than or equal to 10 nm. When the sizes (diameters) of electrically-conductive inorganic particles, such as metal particles, become approximately a few nanometers (nm), a so-called melting-point drop phenomenon occurs, and the inorganic particles melt at a temperature that is remarkably lower than the bulk melting point of the substance of the inorganic particles. Therefore, even at a relatively low temperature, the electrically-conductive inorganic particles are united with each other, and electrical conductivity can be exhibited. Further, when the material liquid is applied to the substrate or the like by an inkjet method, it is necessary that the diameter of the inorganic particle 20 is smaller than the nozzle diameter to prevent clogging of the nozzle when the material liquid is output from the nozzle.

The average diameter of the inorganic particles is measured by using a dynamic light scattering method, such as a photon correlation method. Examples of apparatus for measuring the particles by using the dynamic light scatting method are Dynamic light-Scattering Photometer DLS-8000 series, manufactured by Otsuka Electronics Co., Ltd, Concentrated-Type Particle Diameter Analyzer FPAR-1000, manufactured by Otsuka Electronics Co., Ltd., Dynamic Light Scattering Type Nanotrac Particle Size Distribution Measurement Apparatus UPA-EX150, manufactured by NIKKISO CO. LTD., and the like.

Further, the dispersant 30 is not particularly limited as long as the dispersant 30 can bind to the surfaces of the inorganic particles by chemical bonds that can be broken by oxidation in the later step B. However, it is desirable that the dispersant 30 has stable dispersion characteristic.

The chemical bonds that can be broken by oxidation are, for example, coordination bonds. Therefore, it is desirable that the dispersant 30 has a group (radical) that can bind with the composition element of the inorganic particle 20 by coordination bond. Examples of the group that can bind with the composition element of the inorganic particle 20 by coordination bond are an amino group, a sulfanyl group, a hydroxy group, an ether group and the like. Further, in the oxidation process, the bonds between the dispersant 30 and the inorganic particles 20 may be broken by a reaction with the organic solvent contained in the material liquid. For example, the inorganic particles 20 may be coated with the dispersant 30 by the aforementioned chemical bonds by using alkanethiol, alkylamine or the like, as the dispersant 30.

Further, the organic solvent contained in the material liquid is not particularly limited as long as the inorganic particles 20 coated with the dispersant 30 can be dispersed in the organic solvent. However, it is desirable that the organic solvent can be easily decomposed in the later step B. Further, the material liquid may contain an organic solvent, such as an organic acid anhydride, an acid anhydride derivative, and an organic acid, such as a linear saturated carboxylic acid, that supplements the reaction of eliminating the dispersant 30 from the inorganic particles 20.

Next, as illustrated in process II of FIG. 1, at least a part of the organic solvent in the coating 12a is removed by drying at room temperature or the like. At this time, it is desirable that an appropriate amount of organic solvent is removed so that effective oxidation and efficient crystal growth are possible in the later steps B and C. The organic solvent actually volatilizes immediately after application. Therefore, the process of drying at room temperature may be omitted. However, when the organic solvent contains an organic component that does not tend to naturally volatilize, it is desirable that the drying process is carried out. In this process, the dispersant 30 may be slightly heated in such a manner that the dispersant 30 is not eliminated from the surfaces of the inorganic particles 20.

<Step B>

Next, the coating precursor 12 is oxidized at a temperature that exceeds 100° C., and that is less than or equal to the pyrolysis initiation temperature of an organic component that has the highest pyrolysis initiation temperature among the at least one kind of organic component contained in the coating precursor 12, and that is less than or equal to the heat-resistance temperature of the substrate 11 (process III in FIG. 1). In the oxidation process, the chemical bonds between the dispersant 30 and the surfaces of the inorganic particles 20 contained in the coating precursor 12 are broken, and the dispersant 30 is eliminated from the surfaces of the inorganic particles 20. Further, the at least one kind of organic component contained in the coating precursor 12 is decomposed. Consequently, the electrically-conductive inorganic coating is obtained (process IV in FIG. 1).

The method for oxidizing the coating precursor 12 is not particularly limited. Examples of the method for oxidizing the coating precursor 12 are oxidization using oxygen radicals and the like. Oxidization using oxygen radicals may include irradiation of the coating precursor 12 with ultraviolet rays that have wavelengths of 400 nm or less in presence of oxygen or ozone, or irradiation of the coating precursor 12 with oxygen plasma. It is desirable that the wavelength of the ultraviolet rays is less than or equal to 300 nm. Examples of the ultraviolet rays that have wavelengths of 400 nm or less are ultraviolet rays output from a light source, such as a mercury lamp and an excimer lamp.

The oxidization process may be carried out by heating in presence of oxygen. However, such a process is not realistic, because the temperature must be less than or equal to the heat-resistance temperature of the substrate 11. Therefore, the method using the oxygen radicals is desirable, because the method can achieve excellent decomposition efficiency, and the method does not require heating at a high temperature. Such an oxidization process can efficiently eliminate the dispersant 30 that has bound to the surfaces of the inorganic particles 20, and decompose the organic component or components contained in the coating precursor 12.

In the step B, the oxidation process is carried out at a temperature that exceeds 100° C., and that is less than or equal to the pyrolysis initiation temperature of an organic component that has the highest pyrolysis initiation temperature among the at least one kind of organic component contained in the coating precursor 12, and that is less than or equal to the heat-resistance temperature of the substrate 11. The oxidation process under such conditions can eliminate the dispersant 30 and decompose the organic component or components more efficiently than a non-heating oxidation process. Hence, it is possible to efficiently form the electrically-conductive inorganic coating from the coating precursor 12.

Figure 2:
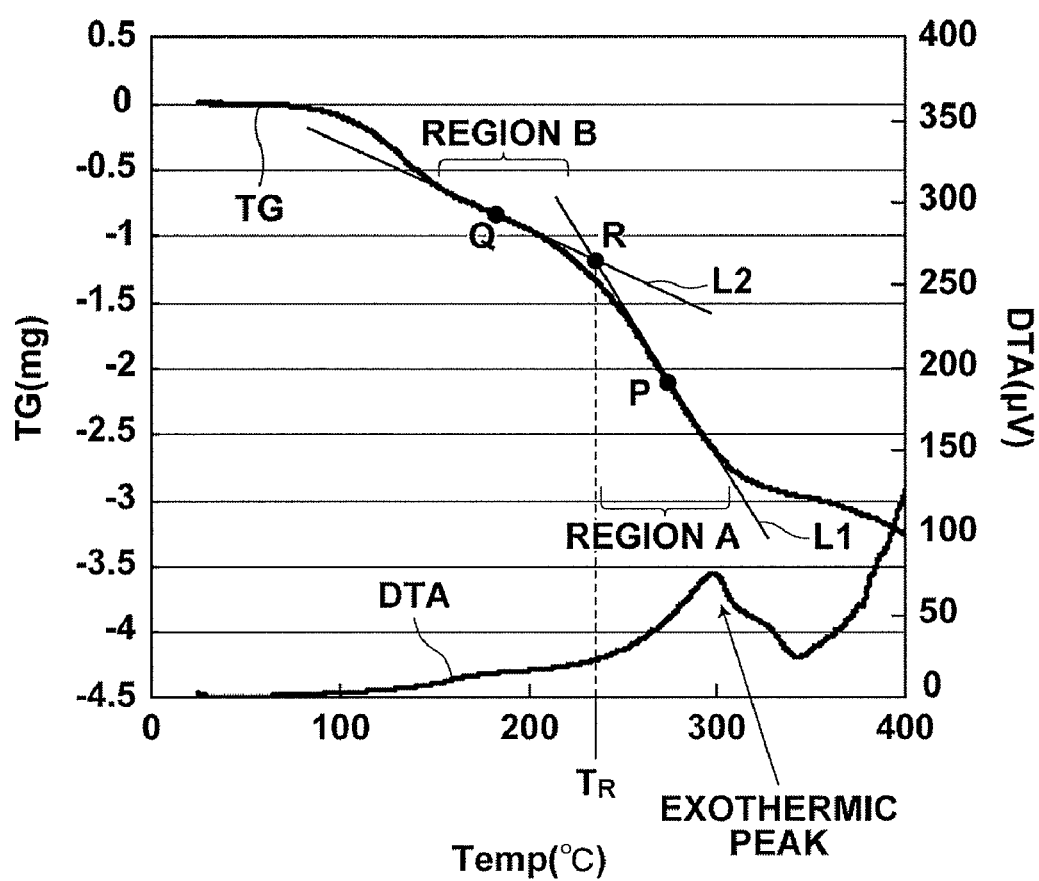
FIG. 2 is a diagram illustrating the result of TG/DTA measurement of Ag paste.

When the coating precursor 12 contains a plurality of kinds of organic components, for example, as in commercially-available Ag nanopaste, the "pyrolysis initiation temperature of an organic component that has the highest pyrolysis initiation temperature among the organic components contained in the coating precursor 12" may be obtained by thermal analysis using TG/DTA (thermogravity/differential thermo analysis) measurement, as described in the section "Summary of the Invention". Specifically, the thermal analysis by TG/DTA measurement is carried out while the temperature is increased by a constant temperature (value). FIG. 2 is a diagram illustrating the result of TG/DTA measurement of the Ag nano paste (Ag1TeH), which was used in Example 3 (the rate of increase in temperature is 10° C./min). In FIG. 2, the "pyrolysis initiation temperature of an organic component that has the highest pyrolysis initiation temperature among the at least one kind of organic component contained in the coating precursor" is temperature $T_R$ (approximately 230° C. in FIG. 2). The temperature $T_R$ is located at intersection R of the tangent line L1 at inflection point P of the TG curve in region A that is immediately before the exothermic peak of the DTA curve and tangent line L2 at inflection point Q that is the closest to the inflection point P among inflection points of the TG curve in region B that is located on the low-temperature side of the region A. When Ag1TeH is used, the organic component that has the highest pyrolysis initiation temperature is the dispersant 30. When the amount of the contained organic solvent is large as in the case of Ag nano paste used in the measurement of FIG. 2, the amount of the solvent may be reduced by drying before the TG/DTA measurement is carried out. In the measurement of FIG. 2, the ink is dried at 130° C. for 20 minutes before the TG/DTA measurement.

The temperature conditions of oxidation are not particularly limited as long as the temperature is within the aforementioned range. However, it is desirable that the temperature conditions can efficiently unite or fuse the multiplicity of inorganic particles 20, from which the dispersant 30 has been removed, by elimination of the dispersant 30 and decomposition of the organic components. The temperature conditions that can unite or fuse the inorganic particles 20 differ depending on the kind of the composition element of the inorganic particles 20 and the diameters of the inorganic particles 20. When the average diameter of the inorganic particles 20 is in nano order (100 nm or less), the inorganic particles can be efficiently united or fused together at a temperature exceeding 100° C., regardless of the kind of the composition element of the inorganic particles 20. Generally, as the diameters of the inorganic particles 20 are smaller, the temperature for obtaining the low-resistance electrically-conductive coating 1 becomes lower. When the present invention is applied to the organic particles that have large diameters, or when more efficient electrical conductivity needs to be obtained, it is desirable that the temperature condition of the oxidation process is higher than or equal to 120° C., and optionally higher than or equal to 140° C. Before the inorganic particles 20 start uniting together, the dispersant 30 has been efficiently removed from the surfaces of the inorganic particles 20, and the inorganic component or components have been efficiently decomposed. Therefore, the amount of the remaining organic substance is small. Hence, it is possible to obtain the low-resistance electrically-conductive inorganic coating 1.

Heating may be carried out by using a heater or the like. However, when the light source, such as the mercury lamp and the excimer lamp, that is used in the oxidation process includes a heating mechanism or the like, the heating process may be carried out at the same time as the oxidation process by irradiation of the ultraviolet rays from the light source.

The length of the time period of the oxidation process may be appropriately designed based on the kind of the substrate, the kind of the material liquid (the kind of the dispersant 30, the particle diameters of the inorganic particles 20, the density, and the like), and the heating temperature. For example, when the material liquid is metal nano paste in which the dispersant 30 is eliminated from the surfaces of the dispersion particles 21 approximately at 220° C., and the average particle diameter of the metal particles (inorganic particles 20) is approximately 3 to 7 μm, if the temperature exceeds 100° C. and less than or equal to 150° C., and the process time is approximately in the range of 60 to 150 minutes, the low-resistance electrically-conductive inorganic coating 1 of 0.2 to a few Ω/sq. can be obtained by oxidation using a UV ozone cleaner. The temperature and the process time of oxidation for obtaining the low-resistance electrically-conductive inorganic coating differ depending on the density of ozone and the density of active oxygen during the oxidation process (please refer to the examples that will be described later).

<Step C>

In step C, the electrically-conductive inorganic coating 1 obtained in the step B is fired to obtain a more compact (more precise or firmer) electrically-conductive inorganic coating 1

(process V in FIG. 1). Firing is carried out by heating the electrically-conductive inorganic coating 1 under a condition in which the temperature of the substrate 11 remains less than or equal to the heat-resistance temperature of the substrate 11. The method for firing is not particularly limited, and a method for firing by heating with heat rays is desirable. Examples of heating with the heat rays are a laser anneal method, a flash lamp anneal method, and the like. In the laser anneal method, laser beam L is used as the heat rays, and the electrically-conductive inorganic coating 1 is scanned with the laser beam L to anneal the electrically-conductive inorganic coating 1, thereby making the electrically-conductive inorganic coating 1 more compact. In the flash lamp anneal method, light output from a xenon flash lamp or the like is used.

Since laser annealing is a scan-type heating process using high-energy heat rays, the firing efficiency is high. Further, it is possible to control and adjust the energy that reaches the substrate by changing the irradiation condition of the laser, such as the scan speed and the laser power. Therefore, if the irradiation condition of the laser is determined based on the heat-resistance characteristic of the substrate, it is possible to keep the temperature of the substrate lower than or equal to the heat-resistance temperature of the substrate. Therefore, the laser annealing is desirable when a resin substrate, which has a low heat-resistance characteristic, is used.

The laser light source used for laser annealing is not particularly limited. Examples of the laser light source are a pulse oscillation laser, such as an excimer laser, and a continuous oscillation laser (CW laser: continuous wave laser). Further, a short-wavelength pulse laser beam, such as an excimer laser beam, is desirable, because a large amount of energy of the laser beam is absorbed at a surface portion of the coating, thereby making it possible to easily control energy that reaches the substrate. For a similar reason, when the pulse laser is used, it is desirable that the pulse width is less than or equal to 100 nm, which is short, and optionally, less than or equal to several tens of nanoseconds (ns).

The electrically-conductive inorganic coating 1 according to the present embodiment is produced, as described above.

In the method for producing the electrically-conductive inorganic coating 1 according to the present embodiment, the coating precursor 12 is deposited, by a liquid phase method, by using a material liquid containing a plurality of inorganic particles 20 and an organic solvent, and the plurality of inorganic particles are coated with the dispersant 30 that binds to the surfaces of the inorganic particles 20 by chemical bonds that can be broken by oxidation. After the coating precursor 12 is deposited, the coating precursor is oxidized at a temperature that exceeds 100° C., and that is less than or equal to the pyrolysis initiation temperature of an organic component that has the highest pyrolysis initiation temperature among the at least one kind of organic component, and that is less than or equal to the heat-resistance temperature of the substrate. In the oxidation process under the aforementioned conditions, the dispersant 30 that coats the inorganic particles 20 can be eliminated from the surfaces of the inorganic particles. Further, the at least one kind of organic component contained in the coating precursor 12 can be efficiently decomposed. Accordingly, the low-resistance electrically-conductive inorganic coating 1 can be formed. Therefore, even if firing is carried out through a low-temperature process, in which the temperature of the substrate 11 remains lower than or equal to the heat-resistance temperature of the resin substrate 11, union, fusion and the like of the inorganic particles 20 thereamong is not prevented by the organic substance remaining in the coating. Hence, it is possible to form the low-resistance electrically-conductive inorganic coating 1.

Further, in the method for producing the electrically-conductive inorganic coating 1 of the present invention, even if the dispersant 30 that coats the inorganic particles 20 is highly stable, it is possible to efficiently remove the dispersant 30 from the surface of the inorganic particles 20. Therefore, it is possible to use, as the material liquid, the dispersant 30 of inorganic particles 20 the surfaces of which are coated with the dispersant 30 that has high temperature stability even in a low-temperature process. Further, it is possible to prevent cohesion of the inorganic particles 20 in the material liquid before coating (application). Hence, it is possible to stably produce the electrically-conductive inorganic coating 1.

According to the method for producing the electrically-conductive inorganic coating of the present embodiment, it is possible to produce a low-resistance electrically-conductive inorganic coating 1 that is appropriate for a circuit board, such as a flexible device, easily and at low cost by using a liquid phase method.

"Circuit Board"

Figure 3:
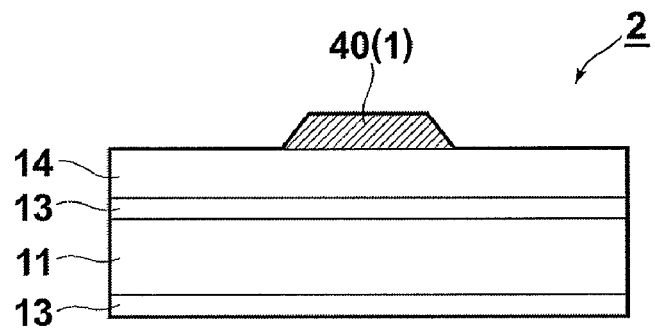
FIG. 3 is a sectional view of a circuit board in the thickness direction of the circuit board according to an embodiment of the present invention.
Figure 4A:
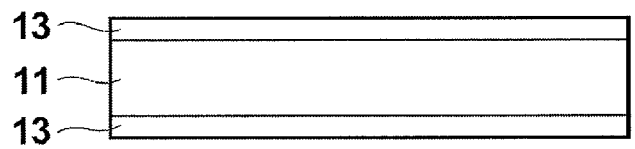
FIG. 4A is a diagram illustrating the process of producing the circuit board illustrated in FIG. 3.
Figure 4B:
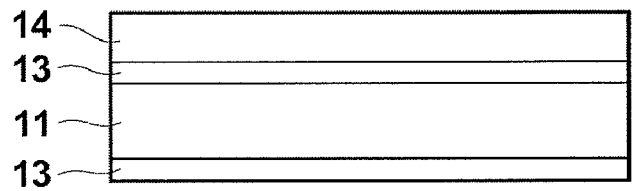
FIG. 4B is a diagram illustrating the process of producing the circuit board illustrated in FIG. 3.
Figure 4C:
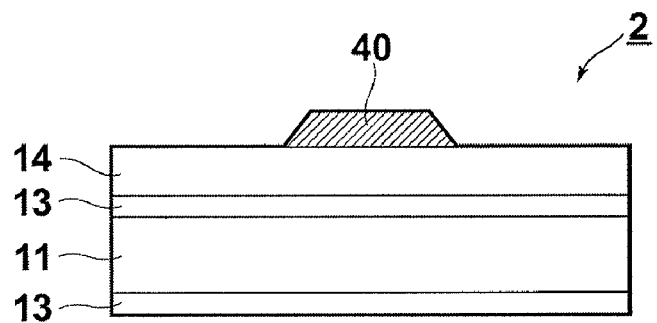
FIG. 4C is a diagram illustrating the process of producing the circuit board illustrated in FIG. 3.

With reference to FIG. 3, a circuit board using the electrically-conductive inorganic coating 1 according to the aforementioned embodiment, and a method for producing the circuit board will be described. FIG. 3 is a sectional view of a circuit board 2 in the thickness direction of the circuit board 2 according to the present embodiment. FIGS. 4A through 4C are diagrams illustrating the process of producing the circuit board 2. In FIGS. 3 and 4A through 4C, the elements are illustrated on a scale that is different from the actual sizes of the elements so that the elements are easily recognized.

As illustrated in FIG. 3, a circuit 40 of the circuit board 2 is formed on the substrate 11 by patterning, and the substrate 11 has gas barrier layers 13 on the bottom and the top thereof. The circuit 40 is obtained by using the electrically-conductive inorganic coating 1 of the aforementioned embodiment.

First, as illustrated in FIG. 4A, the substrate 11 that has a gas barrier layer 13 on each of the bottom and the top thereof is prepared (FIG. 4A). Examples of the substrate 11 are similar to those mentioned in the embodiment of the electrically-conductive inorganic coating 1.

The gas barrier layer 13 prevents oxygen, moisture (water) and the like, which are present in the air, from entering the thin-film device through the substrate 11 that transmits gas, thereby preventing deterioration of the device properties. Generally, it is necessary that the transmission coefficient (permeability coefficient) of the gas barrier layer 13 is approximately in the range of $1 \times 10^{-3}$ to $1 \times 10^{-2}$ g/m²/day with respect to water vapor. The transmission coefficient of the gas barrier layer 13 is determined by the material of the gas barrier layer 13 and the thickness of the gas barrier layer 13. Further, the gas barrier layer 13 may be composed of a plurality of layers. Examples of the gas barrier layer 13 are a SiNx layer, a $SiO_2$ layer and the like.

The method for depositing the gas barrier layer 13 is not particularly limited. The gas barrier layer 13 may be deposited by using a sputtering method, a PVD (physical vapor deposition: physical vapor-phase deposition) method, an evaporation method, or the like.

Next, a thermal buffer layer 14 is formed on the substrate 11 that has the gas barrier layers 13 (FIG. 4B). The thermal buffer layer 14 is composed of a $SiO_2$ layer or the like, and prevents the substrate 11 from being damaged by heat in the firing process that will be described later. Next, the circuit 40 is formed by patterning by using the method for producing the electrically-conductive inorganic coating 1 of the aforementioned embodiment (FIG. 4C).

In the circuit board 2, the circuit 40 is not particularly limited. Examples of the circuit 40 are similar to those mentioned in the embodiment of the electrically-conductive inorganic coating 1. In the present embodiment, the circuit 40 is produced by using a liquid phase method. The method for applying the material liquid to the substrate 11 is not particularly limited. However, it is desirable that the material liquid is applied by using a printing method, such as inkjet printing and screen printing.

In the present embodiment, only the circuit has been formed by using the method for producing the electrically-conductive inorganic coating 1 of the aforementioned embodiment. However, electrodes may be produced in a similar manner.

The circuit board 2 of the present embodiment is produced by the aforementioned steps.

In the circuit board 2 of the present embodiment, a circuit and/or electrodes (or an electrode) obtained by using the electrically-conductive inorganic coating 1 of the aforementioned embodiment are formed on the substrate 11.

Since the electrically-conductive inorganic coating 1 is produced by using the method for producing the electrically-conductive inorganic coating of the aforementioned embodiment, the electrically-conductive inorganic coating 1 has low resistivity. Therefore, the electrically-conductive inorganic coating 1 can be desirably used as a circuit board, such as a flexible device. Further, since the electrically-conductive inorganic coating 1 can be produced by using a liquid-phase method, patterning by direct drawing is possible. Therefore, according to the present embodiment, the circuit board 2 including a low-resistance circuit or electrodes, which have excellent electrical conductivity, can be produced easily and at low cost.

"Semiconductor Apparatus"

With reference to FIGS. 5A through 5D, a semiconductor apparatus using the electrically-conductive inorganic coating 1 of the aforementioned embodiment, and a method for producing the semiconductor apparatus will be described. In the present embodiment, a bottom-gate-type semiconductor apparatus is used as an example. FIGS. 5A through 5D are diagrams illustrating the process of producing a TFT (thin film transistor) (sectional views in the thickness direction of the substrate). In FIGS. 5A through 5D, the elements are illustrated on a scale that is different from the actual sizes of the elements so that they are easily recognized.

In a semiconductor apparatus (TFT: thin film transistor) 3 of the present embodiment, an active layer composed of a semiconductor coating, electrodes (a gate electrode 50, a source electrode 53, and a drain electrode 54), and various kinds of circuits are provided on the substrate 11. The electrodes and the various kinds of circuits are obtained by using the electrically-conductive inorganic coating 1 of the aforementioned embodiment.

First, as illustrated in FIG. 5A, the substrate 11 is prepared, and the gate electrode 50 is formed by using the method for producing the electrically-conductive inorganic coating 1 of the aforementioned embodiment. Examples of the gate electrode are metal, such as Pt, Au, Pd, Cr, Ni, Mo, Nb, Nd, Al, Ag, Ta, W, Cu, Rb, Rh, Ti, In, and Sn, an alloy containing at least one of these metal elements, tin oxides, indium oxides, indium tin oxides (ITO) and the like.

Next, a gate insulation coating 51 made of $SiO_2$ or the like is formed. As the substrate 11, the substrate similar to the one mentioned in the method for producing the electrically-conductive inorganic coating 1 of the aforementioned embodiment may be used.

Next, as illustrated in FIG. 5B, a semiconductor coating 52 is formed by using an application method similar to formation of the gate insulating coating 51. As the semiconductor coating 52, a metal oxide semiconductor coating that contains at least one metal element selected from the group consisting of In, Ga, Zn, Sn, and Ti, and which has semiconductor properties, or a semiconductor coating made of Si and/or Ge is desirable.

Next, as illustrated in FIG. 5C, a source region and a drain region of the semiconductor coating 52 are formed to form an active layer 52a of the TFT. For example, when the semiconductor layer 52 is a silicon semiconductor coating or the like, it is possible to produce an active layer 52a by doping the semiconductor layer 52 with a dopant, such as P and B. A region between the source region and the drain region is a channel region.

Finally, as illustrated in FIG. 5D, a source electrode 53 and a drain electrode 54 are formed on the active layer 52a by using the method for producing the electrically-conductive inorganic coating 1 of the aforementioned embodiment. Further, various kinds of circuits are provided in a similar manner, and the semiconductor apparatus (TFT) 3 of the present embodiment is obtained. Examples of the material for the source electrode 53, the drain electrode 54 and various circuits are similar to those mentioned as the materials for the gate electrode 50.

The semiconductor apparatus (TFT) 3 of the present embodiment is produced by the aforementioned steps.

In the semiconductor apparatus (TFT) 3 of the present embodiment, the active layer 52a made of the semiconductor coating and the electrodes 50, 53 and 54 and various circuits that are obtained by using the electrically-conductive inorganic coating 1 are provided on the substrate 11.

Since the electrically-conductive inorganic coating 1 is produced by using the method for producing the electrically-conductive inorganic coating of the aforementioned embodiment, the electrically-conductive inorganic coating 1 has low resistivity, and is appropriate as electrodes and circuits of a TFT, such as a flexible device. Further, since the electrically-conductive inorganic coating 1 can be produced by using a liquid phase method, patterning by direct drawing is possible. Therefore, according to the present embodiment, easy and low-cost production of the semiconductor apparatus 3 including a low-resistance circuit and electrodes that have excellent electrical conductivity is possible.

"Design Modification"

In the aforementioned embodiments, a case in which the substrate 11 is a resin substrate was used as an example. However, it is not necessary that the substrate 11 is the resin substrate. The present invention can be applied to a substrate, such as a quartz glass substrate and a silicon substrate, other than the resin substrate.

EXAMPLES

Examples of the present invention and Comparative Examples will be described.

Example 1

A silver (Ag) thin film was deposited by using a commercially-available Ag nano paste (hereinafter, referred to as silver paste). As the silver paste, Ag nano paste NPS-J (metal content of 58.6 wt %, average particle diameter of 3 to 7 nm, and viscosity of 9.2 mPa·s), manufactured by Harima Chemicals, Inc., was used (this silver paste contains a dispersant and an organic solvent). The pyrolysis initiation temperature of this silver paste was measured by TG/DTA, and the temperature was 210° C.

First, this silver paste was applied to a PET (polyethylene terephthalate) film substrate by spin coating at 1000 rpm, and dried at room temperature for 180 minutes. Consequently, a coating precursor that has a thickness of 580 nm was deposited. The sheet resistance value R of the obtained room-temperature-dried coating (coating precursor) exceeded $10^8$ Ω/sq. Further, this room-temperature-dried coating was evaluated by XRD, and only a broad diffraction peak derived from the silver nano particles was obtained (A in FIG. 6). In FIG. 6, the diffraction peak positions of silver are illustrated as reference (D in FIG. 6).

The room-temperature-dried coating was oxidized for 60 minutes by using a UV ozone cleaner that has a heating mechanism to obtain a silver coating (thin-film). At this time, the temperature was controlled so that the temperature in the vicinity of the surface of the room-temperature-dried coating gradually increases from the room temperature by irradiation by the UV ozone cleaner and reaches a temperature in the range of 140 to 150° C.

IR measurement was carried out on the obtained silver coating, and it was confirmed that a peak derived from an organic substance was not present, and that the organic substance or substances had been decomposed (please refer to Table 1). Further, XRD measurement was carried out, and it was confirmed that a sharp diffraction peak derived from silver was obtained, and that the coating had excellent crystalline characteristics. Further, the sheet resistance value R of the silver coating was 1.33 Ω/sq. (please refer to Table 1).

Example 2

In Example 2, a room-temperature-dried silver paste coating (coating precursor) was deposited in a manner similar to Example 1 except that a quartz glass substrate was used in Example 2. Although the substrate used in Example 2 was different from Example 1, the sheet resistance value R of the obtained room-temperature-dried sheet and the result of XRD evaluation were similar to those of Example 1. The sheet resistance value exceeded $10^8$ Ω/sq. Further, in XRD, only a broad diffraction peak derived from the silver nano particles was obtained (A in FIG. 6).

Next, the room-temperature-dried coating was oxidized in a manner similar to the oxidation in Example 1 except that the irradiation time in Example 2 was 90 minutes, to obtain a silver coating. IR measurement was carried out on the obtained silver coating, and it was confirmed that a peak derived from an organic substance was not present, and that the organic substance or substances had been decomposed (please refer to Table 1). Further, XRD measurement was carried out, and it was confirmed that a sharp diffraction peak derived from silver was obtained, and that the coating had excellent crystalline characteristics. In the XRD, the diffraction intensity was the highest when the angle was 38°, and the intensity was 1730 cps (please refer to Table 1, and B in FIG. 6). Further, the sheet resistance value R of the silver coating was 1.33 Ω/sq. (please refer to Table 1).

Example 3

Example 3 is similar to Example 2 except that Ag nano metal ink Ag1TeH (metal content of 58 wt %, average particle diameter of 3 to 7 nm, and viscosity of 13 mPa·s), manufactured by ULVAC Materials, Inc., was used as the silver paste. The silver coating was deposited on a quartz substrate in a manner similar to Example 2, and evaluation was carried out in a similar manner (this silver paste contains a dispersant and an organic solvent).

IR measurement was carried out on the obtained silver coating, and it was confirmed that a peak derived from an organic substance was not present, and that the organic substance or substances had been decomposed (please refer to Table 1). Further, XRD measurement was carried out, and it was confirmed that a sharp diffraction peak derived from silver was obtained, and that the coating had excellent crystalline characteristics. Further, the sheet resistance value R of the silver coating was 2.28 Ω/sq. (please refer to Table 1).

Next, laser annealing was carried out on the silver coating by irradiating the coating with a KrF excimer laser beam (wavelength was 248 nm) to fire the coating. An attenuator was used to adjust (control) the laser power of the laser irradiating a sample, and the number of times of irradiation was 20 shots. Consequently, when the laser irradiation power was 50 mJ/cm$^2$, the most excellent crystalline characteristics were obtained. Further, the sheet resistance value of the silver coating after firing was 1.2 Ω/sq.

Comparative Example 1

Oxidation using the UV ozone cleaner was not carried out. The silver coating was deposited in a manner similar to Example 1 except that in Comparative Example 1, the coating was fired by heating at 150° C. for 60 minutes. The sheet resistance value R was measured. The sheet resistance value R remained higher than $10^8$ Ω/sq., and it was confirmed that firing substantially did not reduce resistivity.

Comparative Example 2

The silver coating was deposited in a manner similar to Example 2 except that in Comparative Example 2, the heating temperature at the time of oxidation using the UV ozone cleaner was in the range of 90 to 100° C. Further, evaluation was carried out in a similar manner. IR measurement was carried out on the obtained silver coating, and it was confirmed that a peak derived from an organic substance became weak, but the organic substance or substances had not been fully decomposed, in other words, the organic substance or substances remained (please refer to Table 1). Further, XRD measurement was carried out, and it was confirmed that a broad diffraction peak derived from silver was obtained (C in FIG. 6). Further, the sheet resistance value R of the silver coating was 3.0×10$^5$ Ω/sq. (please refer to Table 1). Even when the time period of oxidation was increased to 120 minutes, the resistivity was not reduced.

Comparative Example 3

Oxidation using the UV ozone cleaner was not carried out. The silver coating was deposited in a manner similar to Example 2 except that in Comparative Example 3, firing was carried out by heating at 220° C. for 60 minutes. The silver coating was deposited on the quartz substrate, and evaluation was carried out in a similar manner.

IR measurement was carried out on the obtained silver coating, and it was confirmed that a peak derived from an organic substance was not present, and that the organic substance or substances had been decomposed (please refer to Table 1). Further, XRD measurement was carried out, and it was confirmed that a sharp diffraction peak derived from silver was obtained, and that the coating had an excellent crystalline characteristic. Further, the sheet resistance value R of the silver coating was 0.2 Ω/sq. (please refer to Table 1).

Comparative Example 4

A silver coating was deposited in a manner similar to Comparative Example 1. Further, laser annealing was carried out on the silver coating by irradiating the coating with a KrF excimer laser beam (wavelength was 248 nm), to fire the coating. An attenuator was used to adjust (control) the laser power of the laser irradiating a sample, and the number of times of irradiation was 20 shots. Consequently, when the laser irradiation power was 50 mJ/cm$^2$, the most excellent crystalline characteristics were obtained. Further, the sheet resistance value of the silver coating after firing was 600 Ω/sq. (please refer to Table 1).

Comparative Example 5

A silver coating was deposited in a manner similar to Comparative Example 2. Further, laser annealing was carried out on the coating in a manner similar to Comparative Example 4 to fire the coating. Consequently, when the laser irradiation power was 50 mJ/cm$^2$, the most excellent crystalline characteristics were obtained. Further, the sheet resistance value of the silver coating after firing was 50 Ω/sq. (please refer to Table 1).

which heating temperature was 150° C., which is lower than or equal to the heat-resistance temperature of the PET substrate, the coating became compact (precise or firm) only by decomposition of the solvent, in other words, the dispersant that coats the silver nano particles was not oxidized, and mostly remained. Therefore, the silver nano particles did not become united with each other or the like. Hence, the resistivity did not become lower. In Comparative Example 3, in which the temperature of firing was 220° C., which is in the vicinity of the pyrolysis temperature of the dispersant, the resistivity of the coating was efficiently reduced. However, such a temperature, namely 220° C., is not applicable to a resin substrate that has low heat-resistance.

Further, according to the result of Example 2 and the result of Comparative Example 2, and as B and C in FIG. 6 show, it was confirmed that the effect (degree) of reducing the resistivity differs depending on the heating temperature during oxidation by using the UV ozone cleaner. It can be analyzed that in Comparative Example 2, in which the heating temperature was less than or equal to 100° C., the efficiency of eliminating the dispersant by oxidation was not as excellent as Example 2, and that after the dispersant was eliminated, the silver nano particles were not efficiently united with each other. Hence, in Comparative Example 2, the resistance value of the obtained silver coating was high.

In Example 3, it was confirmed that the resistivity was further reduced by carrying out laser annealing to fire the

TABLE 1

| | SUBSTRATE | OXIDATION | HEATING TEMPERATURE (° C.) | OXIDATION AND HEATING TIME (min) | LASER ANNEAL AFTER OXIDATION | Ag PASTE | PEAK INTENSITY OF IR SPECTRUM OF ORGANIC SUBSTANCE AFTER PRE-PROCESSING | SHEET RESISTANCE VALUE (Ω/sq.) |
|---|---|---|---|---|---|---|---|---|
| EXAMPLE 1 | PET | UV OZONE PROCESSING | 140-150 | 60 | NONE | NPS-J | NONE | 1.33 |
| EXAMPLE 2 | QUARTZ | UV OZONE PROCESSING | 140-150 | 90 | NONE | NPS-J | NONE | 0.33 |
| EXAMPLE 3 | QUARTZ | UV OZONE PROCESSING | 140-150 | 90 | 50 mJ, 20 shot | Ag1TeH | NONE | 1.20 |
| COMPARATIVE EXAMPLE 1 | PET | NONE | 150° C. | 60 | NONE | NPS-J | NO CHANGE 10$^8$ | EXCEEDING |
| COMPARATIVE EXAMPLE 2 | QUARTZ | UV OZONE PROCESSING | 90-100 | 90 | NONE | NPS-J | DECREASE | 3.0 × 10$^5$ |
| COMPARATIVE EXAMPLE 3 | QUARTZ | NONE | 220° C. | 60 | NONE | NPS-J | NONE | 0.20 |
| COMPARATIVE EXAMPLE 4 | QUARTZ | UV OZONE PROCESSING | 90-100 | 90 | 50 mJ, 20 shot | NPS-J | DECREASE | 600 |
| COMPARATIVE EXAMPLE 5 | QUARTZ | NONE | 220° C. | 60 | 50 mJ, 20 shot | NPS-J | NONE | 50 |

EVALUATION

According to Examples 1 through 3, it was confirmed that a silver coating that has low resistivity, and which has excellent electrical conductivity, can be formed by using the method for producing the electrically-conductive inorganic coating 1 of the aforementioned embodiments, regardless of whether the substrate is a quartz substrate or a PET substrate, which has low heat-resistance.

Further, according to the result of Example 1 and the result of Comparative Example 1, the resistance values of the obtained silver coatings greatly differ depending on whether oxidation process is carried out by using the UV ozone cleaner. It can be analyzed that in Comparative Example 1, in coating after oxidation. In contrast, in Comparative Examples 4 and 5, in which firing was carried out on coatings in which the dispersant was not sufficiently eliminated and the organic component was not sufficiently decomposed, the resistivity was not sufficiently reduced by firing.

As described above, the present invention has exhibited advantageous effects.

Further, the electrically-conductive inorganic coating 1 of the present invention can be applied to a metal circuit or the like of a semiconductor apparatus, such as a thin film transistor (TFT), in a desirable manner.

What is claimed is:

1. A method for producing an electrically-conductive inorganic coating, the method comprising the steps of:

(A) depositing, on a substrate, a coating precursor that contains a plurality of inorganic particles and at least one kind of organic component by a liquid phase method by using a material liquid containing the plurality of inorganic particles and an organic solvent, the plurality of inorganic particles coated with a dispersant that binds to the surfaces of the inorganic particles by chemical bonds that can be broken by oxidation; and (B) oxidizing the coating precursor at a temperature that exceeds 100° C., and that is less than or equal to the pyrolysis initiation temperature of an organic component that has the highest pyrolysis initiation temperature among the at least one kind of organic component, and that is less than or equal to the heat-resistance temperature of the substrate, thereby breaking the chemical bonds between the dispersant and the surfaces of the inorganic particles contained in the coating precursor to eliminate the dispersant from the surfaces of the inorganic particles, and decomposing the at least one kind of organic component contained in the coating precursor to form the electrically-conductive inorganic coating, wherein step A and step B are sequentially carried out.

2. A method for producing an electrically-conductive inorganic coating, as defined in claim 1, wherein the heat-resistance temperature of the substrate is less than or equal to 200° C.

3. A method for producing an electrically-conductive inorganic coating, as defined in claim 2, wherein the heat-resistance temperature of the substrate is less than or equal to 150° C.

4. A method for producing an electrically-conductive inorganic coating, as defined in claim 1, wherein the inorganic particles contain, as a main component, at least one kind of inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, and In, and alloys of these elements, and oxides of these elements.

5. A method for producing an electrically-conductive inorganic coating, as defined in claim 1, wherein the oxidizing process in the step B uses oxygen radicals.

6. A method for producing an electrically-conductive inorganic coating, as defined in claim 5, wherein the oxidizing process in the step B includes irradiation of the coating precursor with ultraviolet rays that have wavelengths of 400 nm or less in presence of oxygen or ozone, or irradiation of the coating precursor with oxygen plasma.

7. A method for producing an electrically-conductive inorganic coating, as defined in claim 1, wherein the average particle diameter of the inorganic particles is less than or equal to 100 nm.

8. A method for producing an electrically-conductive inorganic coating, as defined in claim 1, the method further comprising the step of:

(C) firing the electrically-conductive inorganic coating at a temperature less than or equal to the heat-resistance temperature of the substrate after the step B.

9. A method for producing an electrically-conductive inorganic coating, as defined in claim 8, wherein the firing process in the step C is carried out by a heating process using heat rays.

10. A method for producing an electrically-conductive inorganic coating, as defined in claim 9, wherein a laser beam is used as the heat rays.

11. A circuit board comprising:
a circuit obtained by using the electrically-conductive inorganic coating produced by using the method for producing the electrically-conductive inorganic coating, as defined in claim 1.

12. A semiconductor apparatus comprising:
a circuit and/or electrodes obtained by using the electrically-conductive inorganic coating produced by using the method for producing the electrically-conductive inorganic coating, as defined in claim 1.

* * * * *